(12) United States Patent
Hornung (10) Patent No.: US 6,890,618 B2
(45) Date of Patent: May 10, 2005

(54) METHOD AND APPARATUS FOR RETAINING A THERMALLY CONDUCTIVE PIN IN A THERMAL SPREADER PLATE

(75) Inventor: Craig W. Hornung, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 131 days.

(21) Appl. No.: 10/238,341

(22) Filed: Sep. 10, 2002

(65) Prior Publication Data

US 2004/0048039 A1 Mar. 11, 2004

(51) Int. Cl.$^7$ ................................................ B32B 3/24
(52) U.S. Cl. ..................... 428/139; 428/140; 428/119; 428/913; 428/901; 174/16.3; 165/80.3; 165/80.2; 257/712; 257/713; 257/717; 257/718; 257/719; 361/697; 361/718; 361/719; 361/717; 29/443; 29/515; 29/509
(58) Field of Search .................. 428/139, 140, 428/119, 913, 901; 174/16.3; 165/80.3, 80.2; 361/697, 718, 719, 717; 257/719, 712, 713, 717, 718; 29/443, 509, 515

(56) References Cited

U.S. PATENT DOCUMENTS

| | | | | |
|---|---|---|---|---|
| 3,483,826 A | * | 12/1969 | Davis ........................... | 74/519 |
| 4,226,281 A | * | 10/1980 | Chu ........................... | 165/80.2 |
| 4,235,283 A | * | 11/1980 | Gupta ........................ | 165/80.4 |
| 4,528,500 A | * | 7/1985 | Lightbody et al. .......... | 324/537 |
| 5,097,385 A | * | 3/1992 | Chao-Fan Chu et al. ... | 361/703 |
| 5,294,830 A | * | 3/1994 | Young et al. ................ | 257/714 |
| 5,569,039 A | * | 10/1996 | Bailey et al. ............... | 439/76.1 |
| 5,717,248 A | * | 2/1998 | Neumann et al. ........... | 257/718 |
| 5,870,286 A | * | 2/1999 | Butterbaugh et al. ....... | 361/704 |
| 6,062,870 A | * | 5/2000 | Hopfer et al. ................ | 439/66 |
| 6,212,070 B1 | * | 4/2001 | Atwood et al. ............. | 361/704 |
| 6,377,460 B1 | * | 4/2002 | Pohl et al. ................... | 361/704 |
| 6,591,897 B1 | * | 7/2003 | Bhatti et al. ............... | 165/80.3 |

* cited by examiner

*Primary Examiner*—William P. Watkins, III (57) ABSTRACT

An apparatus and method are provided for retaining thermal transfer pins in a spreader plate adapted to transfer thermal energy from an electronic component. The spreader plate includes pin holes that slidably receive the thermal transfer pins. The apparatus includes a retention member located proximate each pin hole. The retention member interferes with a range of motion of an associated pin in order to retain the associated pin within the pin hole.

16 Claims, 8 Drawing Sheets

METHOD AND APPARATUS FOR RETAINING A THERMALLY CONDUCTIVE PIN IN A THERMAL SPREADER PLATE

BACKGROUND OF THE INVENTION

The present invention generally relates to a process and apparatus for retaining conductive pins in pin holes of a spreader plate adapted for thermal transfer. More particularly, the present invention relates to a process for creating retention members about the pin holes to retain the conductive pins within a variable gap interface between the spreader plate and an electronic component.

Electronic devices such as computers contain numerous circuit boards. Each circuit board generally has other electronic components, such as silicon microprocessor chips, mounted and electrically connected thereto. Often the electronic components are connected to the circuit board at an angle to the circuit board such that a top surface of the electronic component is also oriented at an angle to the circuit board. Additionally, the top surfaces of the electronic components may have contours or depressions such that the top surface is not flat or continuous. During operation, the electronic components generate a substantial amount of heat as electrical signals are sent between the electronic components and the circuit board. Typically, heat sinks are connected to the electronic components to absorb and dissipate the heat created by the electronic component. Because the electronic component may have an angled or variably interrupted top surface, most heat sinks do not uniformly contact the electronic component. Hence, the heat sinks do not absorb heat from the electronic component as efficiently as possible when directly connected to the electronic component.

In the past, a thermally conductive coating containing grease and any one of ceramic, boron or aluminum has been applied to the top surface of an electronic component and covered with a compliant pad. The compliant pad is then covered with additional thermally conductive coating and a heat sink is then positioned on top of the compliant pad. The thermally conductive coating and the compliant pad engage the contours, depressions, and angles of the top surface of the electronic component and conduct heat from the electronic component through the compliant pad to the heat sink.

However, the thermally conductive coating and compliant pad suffer from several drawbacks. First, though the thermally conductive coating is more conductive than air, it is not an overly efficient substance for conducting heat from the electronic component to the heat sink. Additionally, the compliant pad is thick and therefore does not efficiently conduct heat.

Recently, a metal thermal transfer intermediary for use between the electronic component and the heat sink has been proposed using a metal spreader plate and a metal variable gap interface (VGI). The spreader plate has a front surface that retains at least one variable gap interface and a flat uninterrupted rear surface. The variable gap interface has a metal base with an array of pin holes. A spring sits in the bottom of each pin hole and supports a metal cylindrical pin such that a portion of the pin extends out of a mouth of the pin hole. The pin may be pushed downward further into the pin hole with the spring being compressed between the pin and the bottom of the pin hole.

In operation, the pins, metal base, and the interior of the pin holes are covered with a thin layer of the thermal conductive coating. The spreader plate is then inverted and positioned on top of the electronic component such that the pins engage and rest on the top surface of the electronic component. The pins support the spreader plate and are pushed into the pin holes. Groups of pins are located within regions of the spreader plate to engage portions of the top surface of the electronic component that may have a different angle, contour, or depth. Thus, the use of several pins allows for the variable gap interface to engage much of the top surface of the electronic component despite the variable topographical features of the top surface. The rear surface of the spreader plate is then covered with a layer of the thermal conductive coating and the heat sink is then positioned on top of the rear surface of the spreader plate.

Heat is conducted from the top surface of the electronic component to the pins, which in turn conduct the heat through the spring and the metal base through the rear surface of the spreader plate to the heat sink. The use of the retractable metal pins held in a metal base and metal spreader plate efficiently conducts the heat from the electronic component to the heat sink. Additionally, the thermally conductive coating fills in air gaps between the electronic component, the variable gap interface, the spreader plate, and the heat sink to further enhance the thermal conductivity of the assembly.

However, the variable gap interface suffers from drawbacks as well. In the recently proposed variable gap interface, the pins are loosely positioned within the pin holes and the thermally conductive coating on the top of the pins sticks to the electronic component. Thus, the pins are pulled out of the variable gap interface when the variable gap interface is removed from the electronic component. Additionally, the pins may fall out of the pin holes whenever the spreader plate is inverted for positioning on the electronic component.

A need remains for a variable gap interface that overcomes the above problems and addresses other concerns experienced in the prior art.

BRIEF SUMMARY OF THE INVENTION

Certain embodiments of the present invention concern methods and apparatus for retaining thermal transfer pins in a spreader plate adapted to convey thermal energy from an electronic component. The spreader plate includes pin holes that slidably receive the thermal transfer pins. The thermal transfer pins move along a range of motion within the pin holes. The apparatus includes a retention member located proximate each pin hole. The retention member interferes with and defines a limit for the range of motion of an associated pin in order to retain the associated pin within the pin hole.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentality shown in the attached drawings.

DETAILED DESCRIPTION OF THE INVENTION

Figure 1:
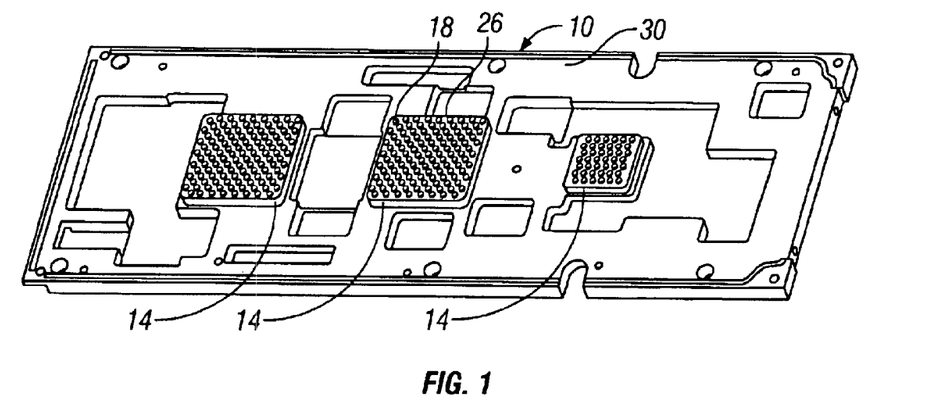
FIG. 1 illustrates a front isometric view of a spreader plate formed according to an embodiment of the present invention.

FIG. 1 illustrates a front isometric view of a spreader plate 10 formed according to an embodiment of the present invention. The spreader plate 10 is rectangular and made of a thermally conductive metal such as aluminum. The spreader plate 10 has a front surface 30, from which extends thermal variable gap interfaces (VGIs) 14 formed therewith. The VGIs 14 are square in shape and include a metal base 26 containing an array of pin holes 22 (FIG. 4) that retain corresponding pins 18. The pins 18 are thermally conductive and retractably held within the pin holes 22 such that the pins 18 may be pushed into the pin holes 22 along a range of motion. During assembly, the pins 18, pin holes 22, and the metal base 26 of each VGI 14 are covered with a layer of a thermally conductive coating 46 (FIG. 3), such as a mixture of grease and any one of ceramic, boron, or aluminum.

Figure 2:
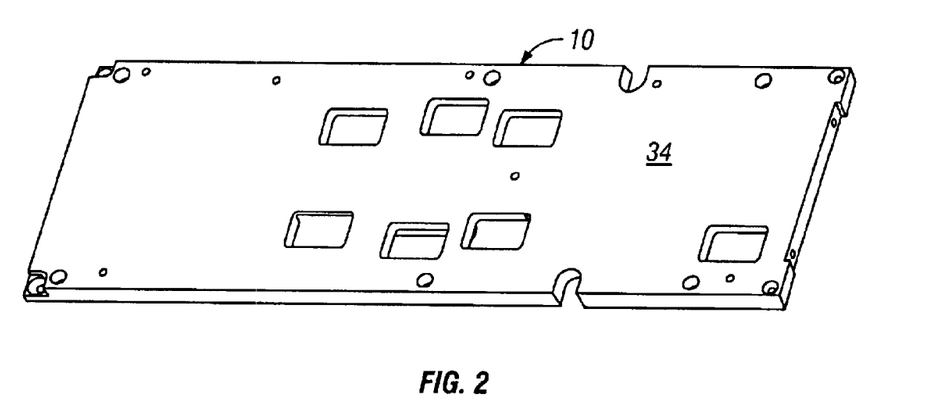
FIG. 2 illustrates a rear isometric view of the spreader plate of FIG. 1.

FIG. 2 illustrates a rear isometric view of the spreader plate 10 of FIG. 1. The spreader plate 10 has a flat rear surface 34 that is also covered with the thermally conductive coating 46 (FIG. 3) during assembly.

Figure 3:
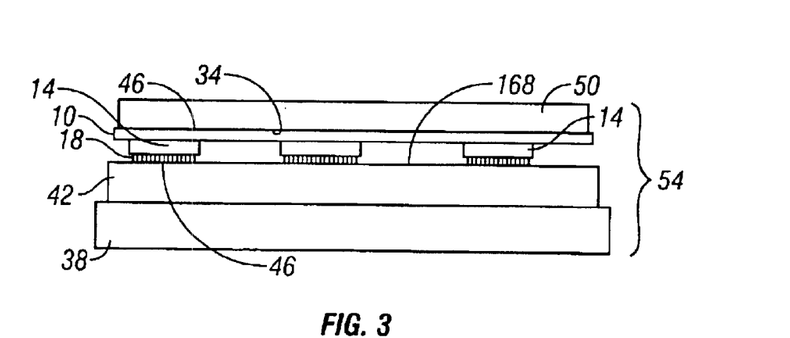
FIG. 3 illustrates a side view of a heat dissipating assembly formed according to an embodiment of the present invention.

FIG. 3 illustrates a side view of a heat dissipating assembly 54 formed according to an embodiment of the present invention. An electronic component 42 (for example, a silicon microprocessor chip) is connected to, and extends from, a circuit board 38. The spreader plate 10 is then positioned on top of the electronic component 42 such that the pins 18 of the VGIs 14, which are covered with the thermally conductive coating 46, are firmly pressed against a top surface 168 of the electronic component 42 and compressed by different amounts within the pin holes 22 (FIG. 4) in order to accommodate the variable surface features of the electronic component 42. A heat sink 50 is then connected to the rear surface 34 of the spreader plate 10, which is also covered with the thermally conductive coating 46. In operation, the electronic component 42 generates heat that is conducted from the electronic component 42 through the thermally conductive coating 46 to the pins 18. The pins 18 are partially retracted into the pin holes 22 (FIG. 4) and conduct the heat through the rear surface 34 of the spreader plate 10 and through another layer of thermally conductive coating 46 to the heat sink 50 which absorbs and dissipates the excess heat.

Figure 4:
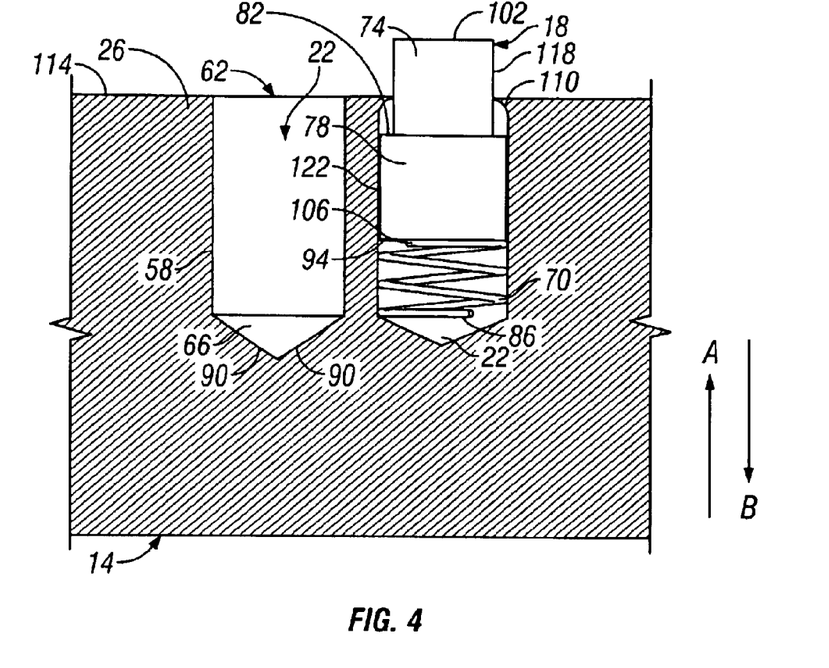
FIG. 4 illustrates a cutaway side partial view of a variable gap interface (VGI) with a pin retained in a first pin hole proximate an empty second pin hole formed according to an embodiment of the present invention.

FIG. 4 illustrates a cutaway side partial view of a VGI 14 with a pin 18 retained in a first pin hole 22 proximate an empty second pin hole 22 formed according to an embodiment of the present invention. Each pin hole 22 has an inner wall 58 extending into the metal base 26 from a cylindrical mouth 62 at a front surface 114 of the metal base 26 to a pointed bottom portion 66 defined by angled walls 90. A portion of the front surface 114 of the metal base 26 is deformed about the mouth 62 of the pin hole 22 to form retention material or retention members 110.

The pin holes 22 each receive and retain a spring 70 and a pin 18. The spring 70 has a top end 106 and a bottom end 86. The pin 18 is cylindrical and has first and second segments 74 and 78. The first segment 74 has a smaller diameter than the second segment 78 such that the pin 18 has a stepped outer surface defined by outer walls 118 and 122 of the first and second segments 74 and 78, respectively. A ledge 82 is located at an intersection between the first and second segments 74 and 78. The first segment 74 has a top surface 102 and the second segment 78 has a bottom surface 94.

In operation, the spring 70 is compressed in the pin hole 22 between the bottom portion 66 and the pin 18. The bottom end 86 of the spring 70 is resistibly engaged by the angled walls 90 of the bottom portion 66 and the top end 106 of the spring 70 is resistibly engaged by the bottom surface 94 of the pin 18. The compressed spring 70 pushes the pin 18 upward in the direction of arrow A. The first segment 74 of the pin 18 extends up through the mouth 62 out of the pin hole 22. The retention members 110 extending along the front surface 114 of the metal base 26 resistibly engage the ledge 82 downward in the direction of arrow B such that the second segment 78 of the pin 18 is retained within the pin hole 22 and engaging the spring 70 at the top end 106.

The pin 18 may be positioned downward further into the pin hole 22 in the direction of arrow B such that the ledge 82 no longer engages the retention members 110 and the spring 70 is further compressed between the pin 18 and the angled walls 90 of the bottom portion 66. Also, the retention members 110 hold the pin 18 in the pin hole 22 such that the VGI 14 may be inverted upside down without the pin 18 falling out of the pin hole 22. Thus, the VGI 14 may be positioned on the electronic component 42 (FIG. 3) without the pins 18 falling out of the pin holes 22. Additionally, the pins 18 may be pushed further into the pin holes 22 as the pins 18 are resistibly engaged by the top surface 168 (FIG. 3) of the electronic component 42. Because each pin 18 retracts individually, the VGI 14 may be firmly pressed against an electronic component 42 having an angled, variable, or contoured top surface 168 with each pin 18 engaging the top surface 168. Heat is conducted from the electronic component 42 through the thermally conductive coating 46 (FIG. 3) to the pin 18. The pin 18, in turn, conducts the heat to the spring 70, which conducts the heat into the metal base 26 at the bottom portion 66 of the pin hole 22. The heat is then conducted through the metal base 26, the rear surface 34 (FIG. 2) of the spreader plate 10 (FIG. 2), and the thermally conductive coating 46 to the heat sink 50 (FIG. 3).

Figure 6:
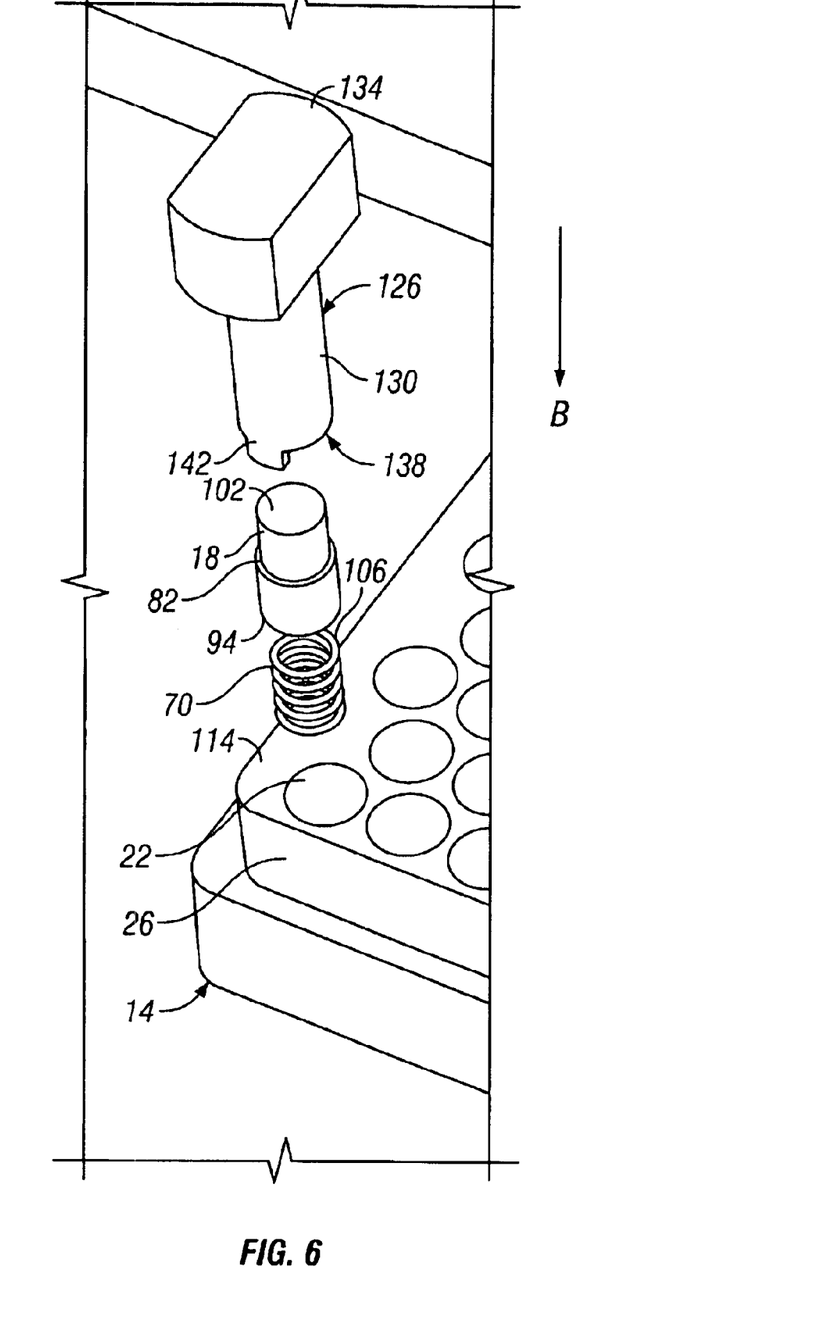
FIG. 6 illustrates an exploded partial isometric view of a VGI, a spring, a pin and a peening tool formed according to an embodiment of the present invention.

FIG. 6 illustrates an exploded partial isometric view of a VGI 14, a spring 70, a pin 18 and a peening tool 126 formed according to an embodiment of the present invention. The peening tool 126 has a cylindrical body 130 formed with a head 134. A contact end 138 of the body 130 opposite the head 134 has two rounded deformation beams 142 oriented on opposite sides of the contact end 138 and directed outward from the body 130.

Figure 7:
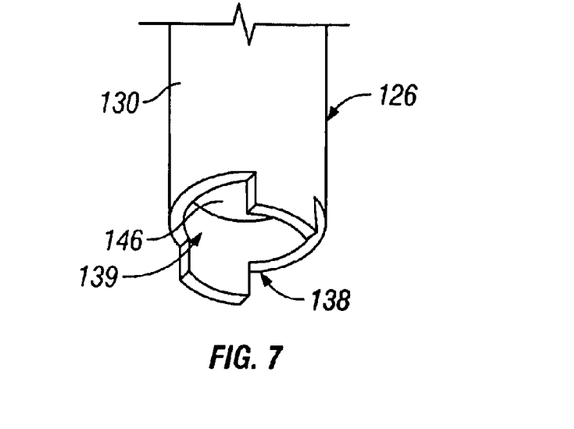
FIG. 7 illustrates an isometric partial view of a portion of a peening tool formed according to an embodiment of the present invention.

FIG. 7 illustrates an isometric partial view of a portion of the peening tool 126. The body 130 contains a flat pin contact surface 146 that is set back a short distance from the contact end 138 to define a cavity 139 that accepts a portion of the pin 18. The pin contact surface 146 engages the top surface 102 (FIG. 6) of the pin 18 (FIG. 6) when the peening tool 126 is used to secure the pin 18 in the VGI 14 (FIG. 6).

Returning to FIG. 6, during assembly, the spring 70 is first inserted into the pin hole 22. The pin 18 is then inserted downward in the direction of arrow B into the pin hole 22 on top of the spring 70 such that the bottom surface 94 of the pin 18 engages the top end 106 of the spring 70. The pin 18 rests atop the spring 70 such that the ledge 82 of the pin 18 extends out of the pin hole 22 above the front surface 114 of the metal base 26. The peening tool 126 is then slid over the pin 18 until the cavity 139 receives the first segment 74 of the pin 18 and the top surface 102 of the pin 18 engages the pin contact surface 146 (FIG. 7) of the peening tool 126.

Figure 8:
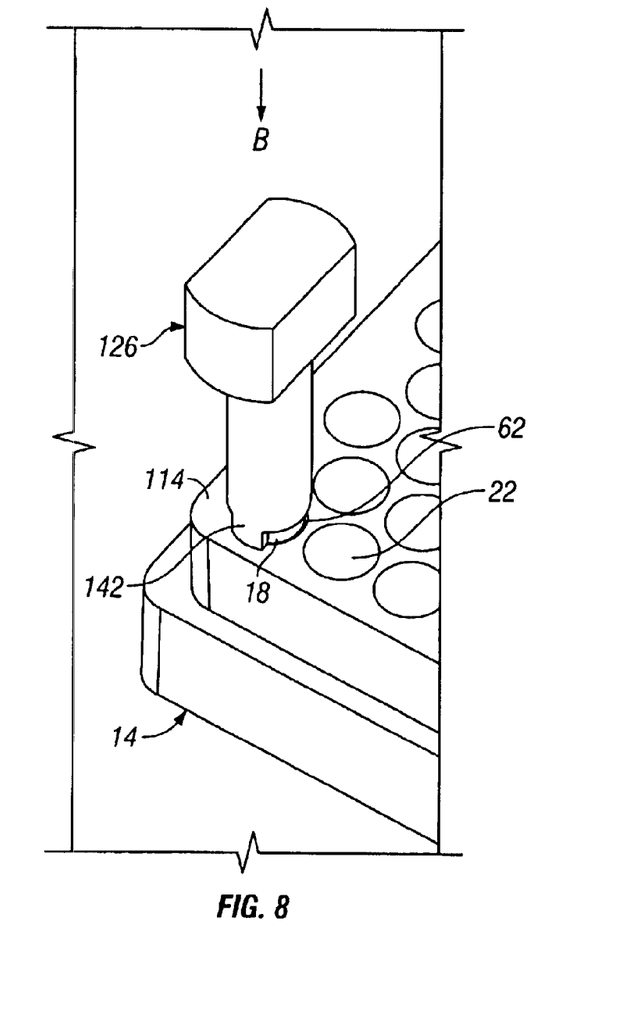
FIG. 8 illustrates an isometric partial view of a peening tool engaging a pin and the metal base of a VGI formed according to an embodiment of the present invention.

As shown in FIG. 8, the peening tool 126 is then pushed downward against the VGI 14 such that the deformation beams 142 engage the front surface 114 of the VGI 14 proximate the mouth 62 of the pin hole 22. The pin contact surface 146 (FIG. 7) pushes the pin 18 into the pin hole 22 in order that the ledge 82 (FIG. 6) moves slightly below the front surface 114 of the metal base 26 about the mouth 62 of the pin hole 22. The peening tool 126 is then struck on the head 134 in the direction of arrow B such that the deformation beams 142 deform portions of the metal base 26 proximate the mouth 62, thereby forming the retention members 110 (FIG. 4).

Alternatively, during mass assembly of the VGIs 14, an array of peening tools are assembled to a press. Each VGI 14 on a spreader plate 10 (FIG. 1) is then positioned under the array of peening tools such that each pin hole 22 is aligned with a peening tool. The press is then closed down on the VGI 14 such that the peening tools deform the front surface 114 of the metal base 26 about all the mouths 62 of the VGI 14 at once. Thus, incorporating an array of peening tools with a press allows for the creation of retention members 110 (FIG. 4) on a mass scale.

Figure 5:
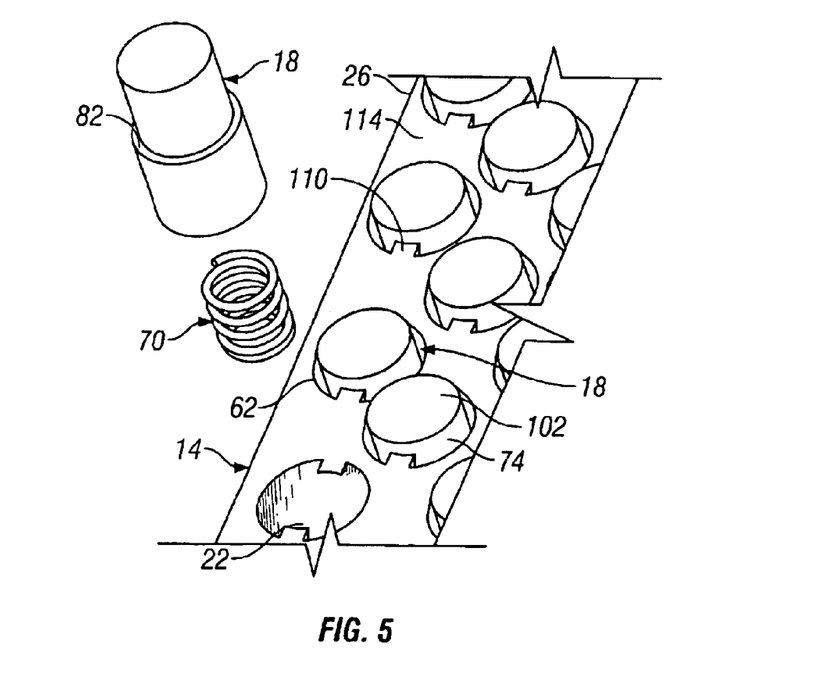
FIG. 5 illustrates an exploded partial isometric view of a VGI, a spring, and a pin formed according to an embodiment of the present invention.

FIG. 5 illustrates an exploded partial isometric view of a VGI 14, a spring 70, and a pin 18 along with an array of pins 18 retained in pin holes 22 by the retention members 110. The retention members 110 created by the deformation beams 142 (FIG. 8) in the front surface 114 of the metal base 26 are located on opposite sides of the mouth 62 of each pin hole 22. The retention members 110 resistibly engage the ledges 82 of the pins 18 to retain the pins 18 within the pin holes 22. Portions of the first segments 74 of the pins 18 retractably extend out of the pin holes 22. The VGI 14 may thus be inverted and positioned on top of the electronic component 42 (FIG. 3) such that the top surfaces 102 of the pins 18 engage the top surface 168 (FIG. 3) of the electronic component 42.

Alternatively, all the material around the mouth 62 of the pin hole 22 may be deformed by a peening tool with a cylindrical deformation beam such that a circular retention member is formed about the mouth 62 to engage the entire ledge 82 of each pin 18.

Figure 9:
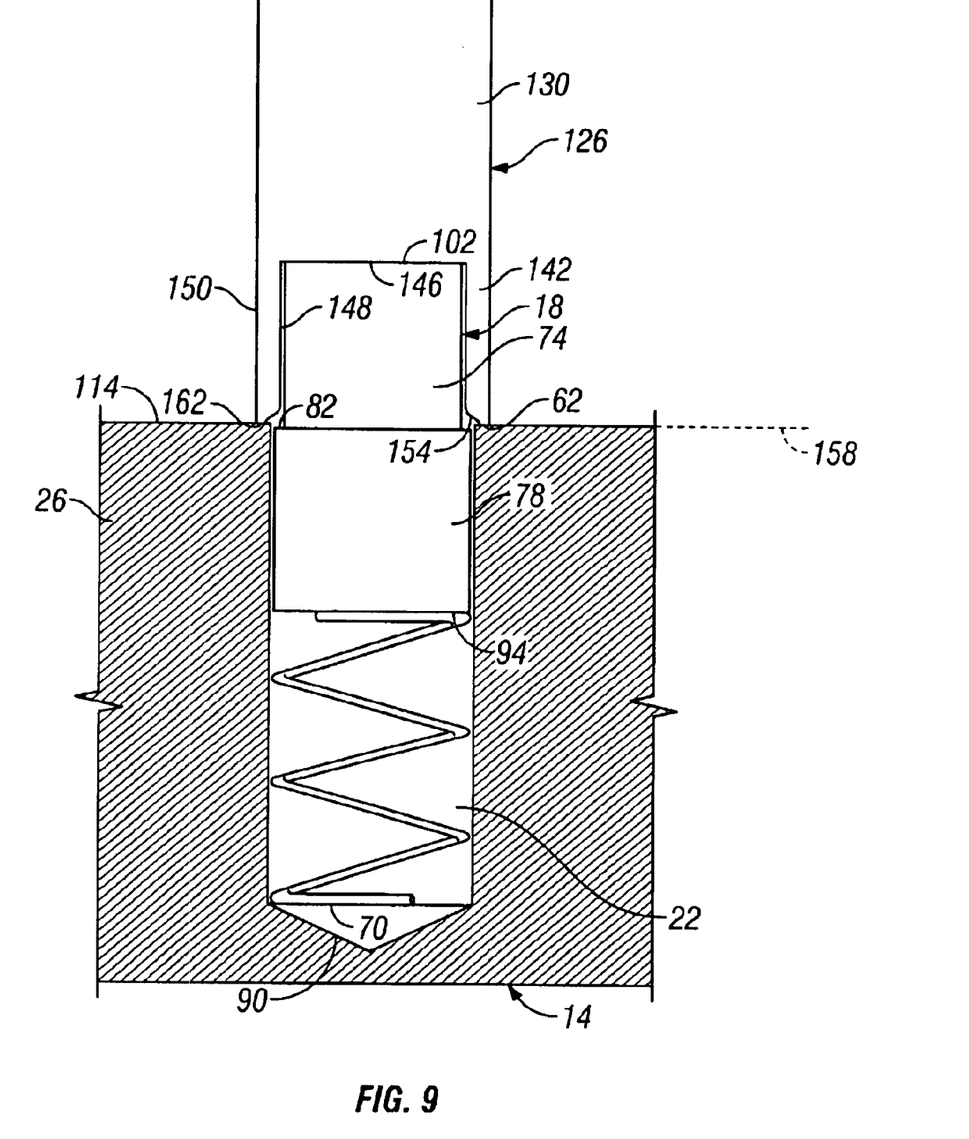
FIG. 9 illustrates a cutaway side partial view of a peening tool engaging a pin and the metal base of a VGI formed according to an embodiment of the present invention.

FIG. 9 illustrates a cutaway side partial view of a peening tool 126 engaging a pin 18 and the metal base 26 of a VGI 14. The body 130 of the peening tool 126 has an inner diameter defined by an inner wall 148 and an outer diameter defined by an outer wall 150. The inner diameter of the body 130 is greater than the outer diameter of the first segment 74 but slightly less than the outer diameter of the second segment 78 and the diameter of the pin hole 22. The outer diameter of the body 130 is greater than the outer diameter of the second segment 78 and the diameter of the pin hole 22. The deformation beams 142 have impact edges 154 that extend at an acute angle to a horizontal axis 158 from the outer wall 150 to the inner wall 148 of the body 130 to define impact tips 162 along the outer wall 150.

The peening tool 126 as shown in FIG. 9 is in an alignment stage where the first segment 74 of the pin 18 is received in the body 130 of the peening tool 126 between the deformation beams 142. The peening tool 126 is positioned on the VGI 14 such that the impact tips 162 engage the metal base 26 about the mouth 62 of the pin hole 22. The pin contact surface 146 engages the top surface 102 of the pin 18 such that the pin 18 is retained in the pin hole 22 with the ledge 82 slightly beneath the front surface 114 of the metal base 26. The spring 70 is thus compressed between the bottom surface 94 of the pin 18 and the angled walls 90 of the pin hole 22.

Figure 10:
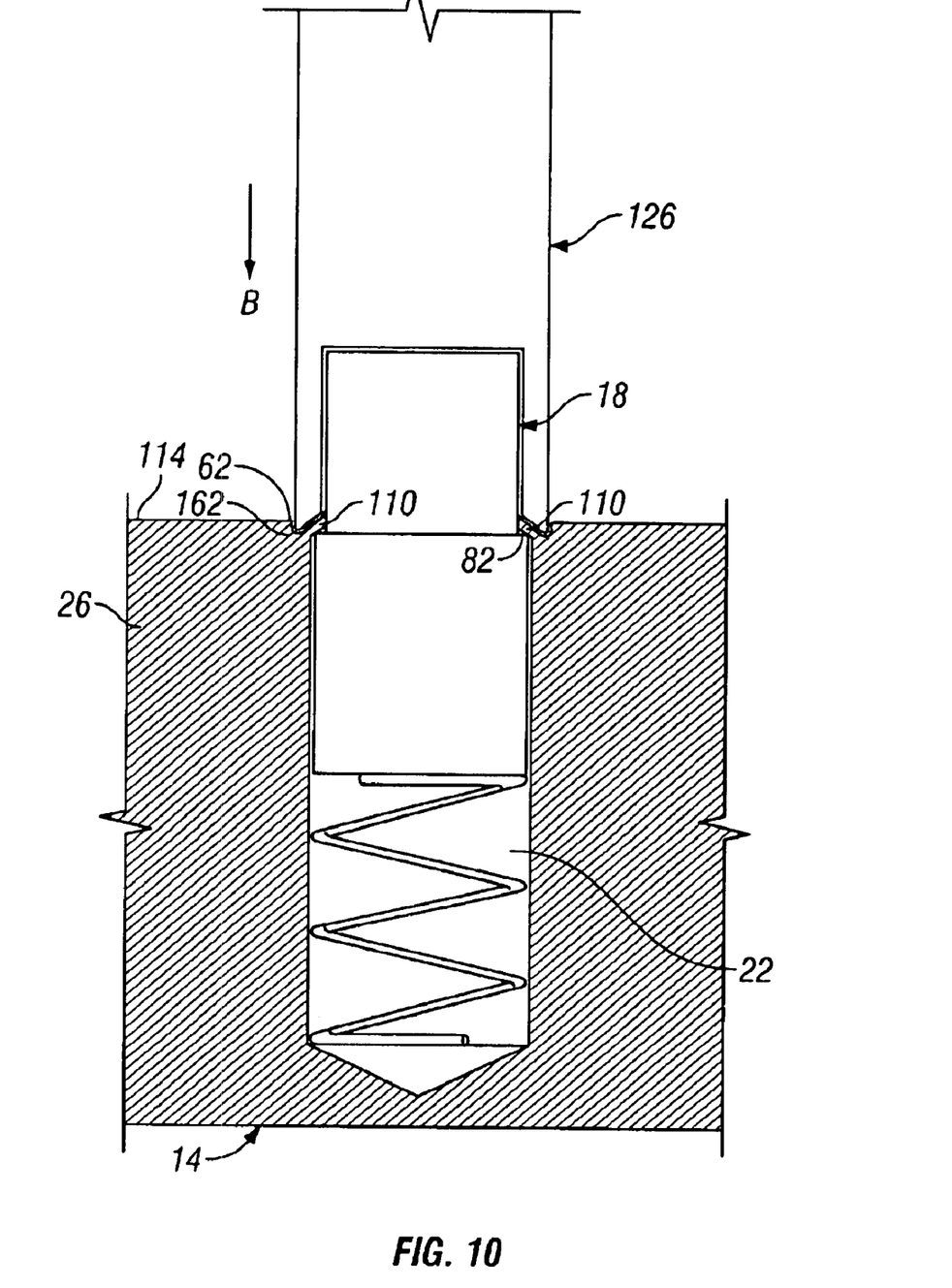
FIG. 10 illustrates a cutaway side partial view of a peening tool, pin, and VGI formed according to an embodiment of the present invention.

FIG. 10 illustrates a cutaway side partial view of the peening tool 126, pin 18, and VGI 14 formed according to an embodiment of the present invention. The peening tool 126 is in an impact stage where it has been struck downward in the direction of arrow B such that the impact tips 162 have pushed into the front surface 114 of the metal base 26 and deformed portions of the front surface 114 about the mouth 62 of the pin hole 22 to form the retention members 110. The retention members 110 resistibly engage the ledge 82 of the pin 18 to hold the pin 18 in the pin hole 22. The peening tool 126 is then removed and used to secure another pin 18 into a pin hole 22.

Figure 11:
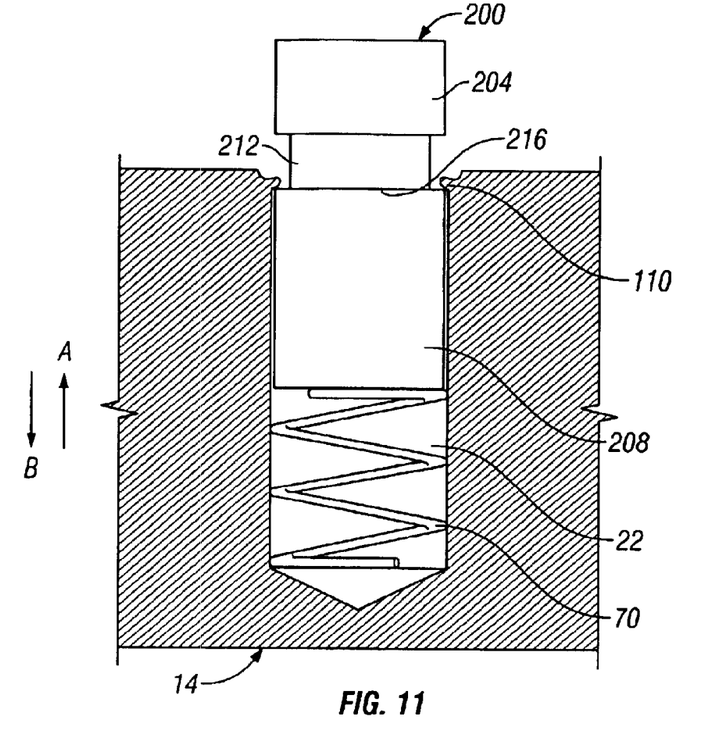
FIG. 11 illustrates a cutaway side partial view of a pin formed according to an embodiment of the present invention.

FIG. 11 illustrates a cutaway side partial view of a pin 200 formed according to an alternative embodiment of the present invention. The pin 200 has first and second segments 204 and 208 having the same outer diameters and that are separated by a small groove 212 in the exterior perimeter of the pin 200. The pin 200 along the groove 212 has a smaller diameter than the first and second segments 204 and 208. As the spring 70 pushes the pin 200 upward in the direction of arrow A, the retention members 110 of the VGI 14 are received in the groove 212 and resistibly engage the pin 200 along a ledge 216 of the groove 212 to retain the pin 200 in the pin hole 22. The retention members 110 are created around the groove 212 of the pin 200 by use of the peening tool 126 shown in FIGS. 9–10. The groove 212 receives the retention members 110 such that the pin 200 may be depressed in the direction of arrow B into the pin hole 22 when the VGI 14 is positioned on the electronic component 42 (FIG. 3).

Figure 12:
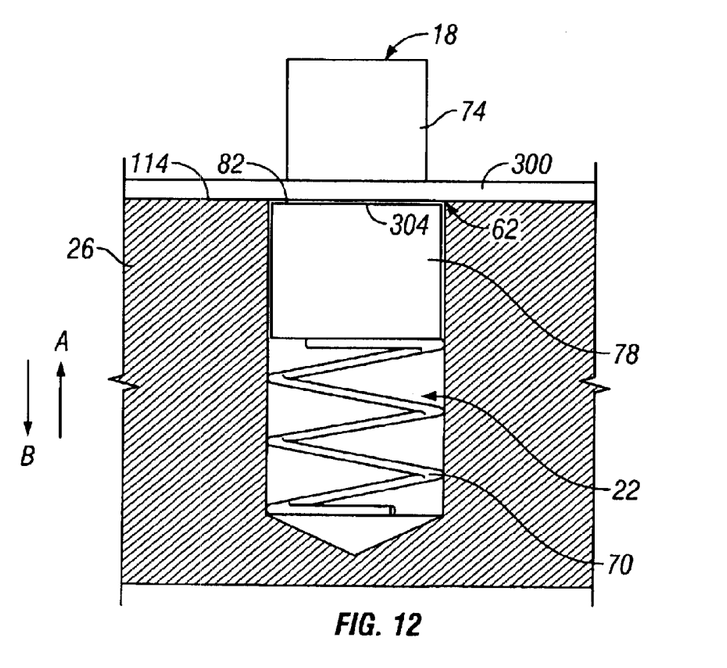
FIG. 12 illustrates a cutaway side partial view of a pin retained in a pin hole formed according to an embodiment of the present invention.

FIG. 12 illustrates a cutaway side partial view of the pin 18 retained in the pin hole 22 formed according to an embodiment of the present invention. A thin metal plate clip 300 is connected to the front surface 114 of the metal base 26 and has an aperture with a smaller diameter than the diameter of the second segment 78. The aperture is positioned about the mouth 62 and receives the first segment 74 of the pin 18. The plate clip 300 has a bottom resistance surface 304 that resistibly engages the ledge 82 of the pin 18 about the mouth 62. The spring 70 pushes the pin 18 upward in the direction of arrow A within the pin hole 22 such that the ledge 82 is resistibly engaged by the resistance surface 304 of the plate clip 300 to retain the pin 18 in the pin hole 22. The pin 18 is depressed in the direction of arrow B into the pin hole 22 against the spring 70 when the pin 18 is positioned against the electronic component 42 (FIG. 3).

Figure 13:
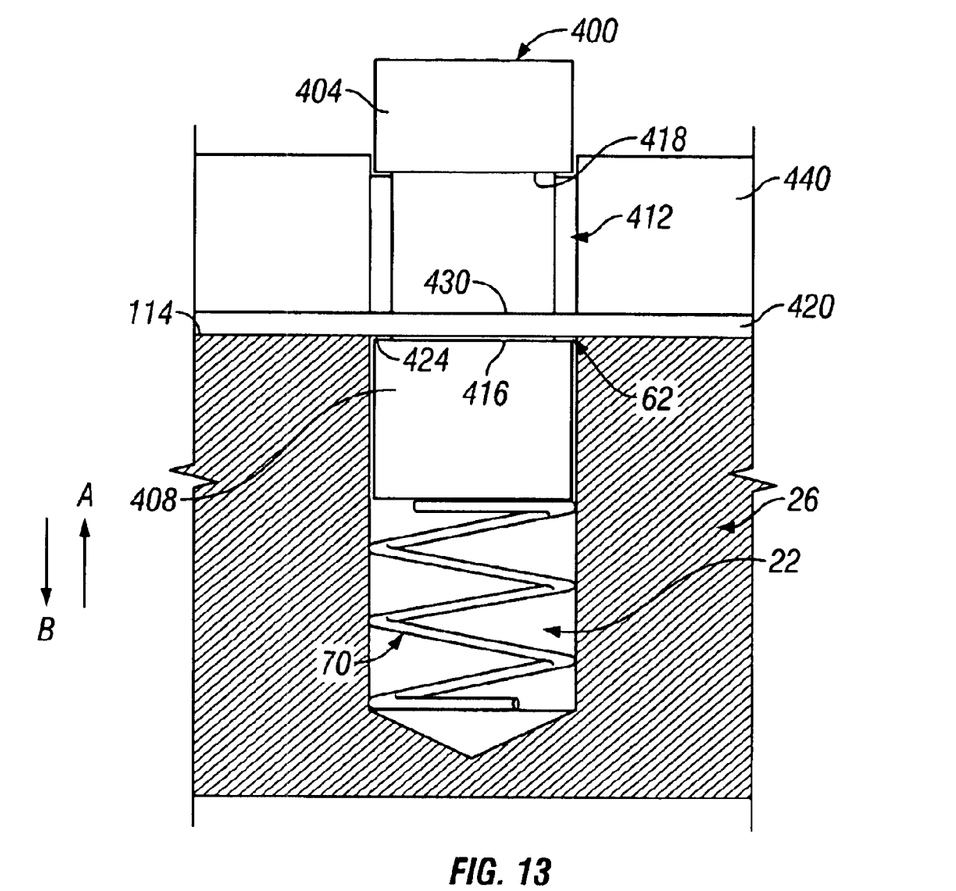
FIG. 13 illustrates a cutaway side partial view of a pin retained in a pin hole formed according to an embodiment of the present invention.

FIG. 13 illustrates a cutaway side partial view of a pin 400 retained in the pin hole 22 formed according to an embodiment of the present invention. The pin 400 has first and second outer segments 404 and 408 having the same outer diameters and that are separated by a peripheral notch 412 extending about the pin 400. The peripheral notch 412 includes a lower ledge 416 and an upper ledge 418. A thin metal plate clip 420 is connected to the front surface 114 of the metal base 26 and has an aperture with a smaller diameter than the diameters of the first and second outer segments 404 and 408. The aperture is positioned about the mouth 62 and receives the peripheral notch 412 of the pin 400. The plate clip 420 has a bottom resistance surface 424 and a top resistance surface 430. The bottom resistance surface 424 resistibly engages the lower ledge 416 of the pin 18 about the mouth 62. A thick cap 440 is connected to the plate clip 420 and has an aperture with a diameter generally equal to the diameter of the pin hole 22 and slightly greater than the diameter of the first outer segment 404. The spring 70 pushes the pin 400 upward in the direction of arrow A within the pin hole 22 such that the lower ledge 416 is resistibly engaged by the bottom resistance surface 424 of the plate clip 420 to retain the pin 400 in the pin hole 22. The pin 400 is depressed in the direction of arrow B into the pin hole 22 when the pin 400 is positioned on the electronic component 42 (FIG. 3) such that the upper ledge 418 of the first outer segment 404 engages the top resistance surface 430 of the plate clip 420. The cap 440 surrounds the first outer segment 404 to guide and support the first outer segment 404 as the pin 18 is depressed in the direction of arrow B into the pin hole 22.

The method and apparatus for retaining the pins in the VGI provides several benefits. Deforming the metal around the mouth of the pin holes to engage a ledge or groove in the pins holds the pins within the pin holes when the VGI is inverted. Thus, the VGI can be used in orientations where the pins are turned upside down to be applied to an electronic component. Also, the retention material retains the pins against the compressed springs in the pin holes such that the first segments of the pins are always extending out of the pin holes when the VGI is unengaged and the first segments can be pushed down into the pin holes when the VGI is engaged against an electronic component. Thus, the retention members allow the pins to efficiently conduct heat away from the electronic component when the electronic component is in any number of orientations and has a variable surface.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. In a spreader plate adapted for thermal transfer from an electronic component, wherein the spreader plate includes a plurality of pin holes formed therein, wherein the pin holes loosely receive thermal transfer pins, and wherein each pin hole includes an inner wall extending between a closed bottom and a mouth of the pin hole, an apparatus for retaining the pins in the pin holes, said apparatus comprising:

a ledge formed on a peripheral portion of at least one pin; and retention material located proximate the pin hole, said retention material interfering with said ledge in order to retain the pin within the pin hole, said retention material including a portion of the inner wall located at the mouth that is deformed into the pin hole into alignment with said ledge.

2. The apparatus of claim 1, wherein said ledge extends about an entire perimeter of the pin.

3. The apparatus of claim 1, wherein said retention material extends about an entire perimeter of the pin hole.

4. The apparatus of claim 1, wherein the pin includes a stepped outer surface defined by first and second segments having different first and second diameters, respectively, said ledge being located at an intersection between said first and second segments.

5. The apparatus of claim 1, wherein the pin includes first and second segments oriented with the first segment located proximate a mouth of the pin hole and with the second segment located proximate a bottom of the pin hole.

6. The apparatus of claim 1, wherein the pin includes a peripheral notch formed about its perimeter, said peripheral notch having a diameter less than a diameter of the pin, said peripheral notch including said ledge, said peripheral notch receiving said retention material with said ledge engaging said retention material.

7. An apparatus for retaining thermal transfer pins in a spreader plate adapted to transfer thermal energy from an electronic component, the spreader plate including pin holes that slidably receive the thermal transfer pins, wherein each pin hole includes an inner wall extending between a closed bottom and a mouth of the pin hole, the apparatus comprising:

a retention member located proximate each pin hole, said retention member interfering with a range of motion of each pin with respect to an associated pin hole in order to retain the associated pin within the pin hole, said retention member including a portion of the inner wall proximate the mouth that is deformed into the pin hole into alignment with a ledge formed about a corresponding pin.

8. The apparatus of claim 7, further comprising a ledge formed on a peripheral portion of each pin, said ledge engaging said retention member when the corresponding pin moves toward a mouth of a corresponding pin hole.

9. The apparatus of claim 7, further comprising a ledge extending around an entire perimeter of each pin, said ledge engaging said retention member.

10. The apparatus of claim 7, wherein said retention member extends about an entire perimeter of each pin hole.

11. The apparatus of claim 7, wherein each pin includes a stepped outer surface defined by first and second segments having different first and second diameters, respectively, said first and second segments defining a ledge at an intersection therebetween that engages said retention member.

12. A method for retaining thermal transfer pins in a spreader plate adapted to transfer thermal energy from an electronic component, the spreader plate including pin holes having a mouth and a closed bottom, the method comprising:

provided thermal transfer pins each having a ledge about a peripheral portion thereof;

inserting the pins into corresponding pin holes through the mouth of the pin holes; and deforming the mouth of each pin hole to form a retention member at least partially about the mouth of each pin hole, each retention member interfering with a ledge on a corresponding pin to retain the pin within the corresponding pin hole.

13. The method of claim 12, further comprising forming the ledge about an entire perimeter of each pin, and forming the retention members about an entire peripheral portion of each pin.

14. The method of claim 12, further comprising forming each pin with a stepped outer surface defined by first and second segments having different first and second diameters, respectively, said first and second segments defining the ledge at an intersection therebetween, the ledge being arranged to interfere with the retention member.

15. The method of claim 12, further comprising deforming the mouth of each pin hole only at locations on opposite sides of the mouth of each pin hole to create a pair of opposed deformed portions extending radially inward into each pin hole.

16. The method of claim 12, further comprising utilizing a peening tool to insert each pin into the corresponding pin hole and then deform the mouth of the corresponding pin hole.

* * * * *